United States Patent
Yoshida et al.

(10) Patent No.: US 9,853,415 B2
(45) Date of Patent: Dec. 26, 2017

(54) SEMICONDUCTOR LASER DEVICE

(71) Applicant: Panasonic Intellectual Property Management Co., Ltd., Osaka (JP)

(72) Inventors: Takayuki Yoshida, Shiga (JP); Jing-Bo Wang, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/322,232

(22) PCT Filed: Jul. 9, 2015

(86) PCT No.: PCT/JP2015/003458
§ 371 (c)(1),
(2) Date: Dec. 27, 2016

(87) PCT Pub. No.: WO2016/009622
PCT Pub. Date: Jan. 21, 2016

(65) Prior Publication Data
US 2017/0149205 A1 May 25, 2017

(30) Foreign Application Priority Data
Jul. 14, 2014 (JP) ................................ 2014-143820

(51) Int. Cl.
*H01S 3/04* (2006.01)
*H01S 5/024* (2006.01)
(Continued)

(52) U.S. Cl.
CPC ........ *H01S 5/02423* (2013.01); *H01S 5/0425* (2013.01); *H01S 5/4025* (2013.01); *H01S 5/42* (2013.01); *H01S 5/02476* (2013.01)

(58) Field of Classification Search
CPC .. H01S 5/02423; H01S 5/0425; H01S 5/4025; H01S 5/42; H01S 5/02476
See application file for complete search history.

(56) References Cited

U.S. PATENT DOCUMENTS

| 6,097,744 A | 8/2000 | Takigawa et al. |
| 2001/0004368 A1* | 6/2001 | Akagi ................ H01S 3/025 372/35 |

(Continued)

FOREIGN PATENT DOCUMENTS

| JP | 1-281786 | 11/1989 |
| JP | 10-209531 | 8/1998 |

(Continued)

OTHER PUBLICATIONS

International Search Report of PCT application No. PCT/JP2015/003458 dated Sep. 8, 2015.
(Continued)

*Primary Examiner* — Kinam Park
(74) *Attorney, Agent, or Firm* — Wenderoth, Lind & Ponack, L.L.P.

(57) ABSTRACT

A semiconductor laser device of the present disclosure includes a cooling plate, an insulating sheet, a first cooling block, and a first semiconductor laser element. The conductive cooling plate includes a water supply passage and a drain passage. The insulating sheet is provided to the cooling plate, and includes a first through hole connected to the water supply passage and a second through hole connected to the drain passage. A first cooling block is provided to the insulating sheet, includes therein a first tube connected to the first through hole and the second through hole, and is electrically conductive. The first semiconductor laser element is provided to the first cooling block. The first semiconductor laser element includes a first electrode, and a second electrode opposite to the first electrode. The first electrode is electrically connected to the first cooling block, and the cooling plate is at a floating potential.

8 Claims, 7 Drawing Sheets

(51) Int. Cl.
  *H01S 5/042* (2006.01)
  *H01S 5/42* (2006.01)
  *H01S 5/40* (2006.01)

(56) References Cited

U.S. PATENT DOCUMENTS

| | | |
|---|---|---|
| 2001/0048698 A1 | 12/2001 | Lorenzen et al. |
| 2004/0035557 A1 | 2/2004 | Minamitani et al. |
| 2004/0161011 A1 | 8/2004 | Tsunekane |
| 2005/0063433 A1 | 3/2005 | Treusch et al. |
| 2005/0082036 A1 | 4/2005 | Minamitani et al. |
| 2006/0227827 A1* | 10/2006 | Kawanishi .......... H01S 5/02423 372/36 |
| 2007/0131954 A1* | 6/2007 | Murayama .......... H01L 25/0753 257/98 |
| 2008/0247432 A1* | 10/2008 | Miyajima ................ H01S 5/024 372/35 |
| 2012/0093183 A1* | 4/2012 | Liu ....................... H01L 23/473 372/35 |
| 2014/0211819 A1 | 7/2014 | Yoshida et al. |

FOREIGN PATENT DOCUMENTS

| | | |
|---|---|---|
| JP | 2001-291925 | 10/2001 |
| JP | 2001-358397 | 12/2001 |
| JP | 2004-047842 | 2/2004 |
| JP | 2005-268446 | 9/2005 |
| JP | 2006-294943 | 10/2006 |
| JP | 2007-134746 | 5/2007 |
| JP | 2008-311491 | 12/2008 |
| JP | 2009-124186 | 6/2009 |
| JP | 2010-040933 | 2/2010 |
| JP | 2012-022819 | 2/2012 |
| WO | 99/39412 | 8/1999 |
| WO | 2009/103531 | 8/2009 |
| WO | 2013/150715 | 10/2013 |

OTHER PUBLICATIONS

Extended European Search Report dated Jul. 25, 2017 in European Application No. 15822750.4.

* cited by examiner

Cooling plate 18:
only flowing of cooling water (720 hours)

No deposit is observed.

FIG. 8B

Cooling plate 18:
not grounded (480 hours)

No deposit is observed.

FIG. 8C

Cooling plate 18:
grounded (522 hours)

Deposit is observed.

FIG. 8D

Cooling plate 18: grounded (2300 hours)

A large amount of deposit is attached and closing hole.

FIG. 9
Prior Art

SEMICONDUCTOR LASER DEVICE

This application is a U.S. national stage application of the PCT international application No. PCT/JP2015/003458.

TECHNICAL FIELD

The present disclosure relates to a high-output semiconductor laser device used as a light source for processing (welding, joining, cutting, and the like) by laser light in the field of industrial applications, and particularly relates to a cooling structure of a semiconductor laser device.

BACKGROUND ART

In recent years, an output of a semiconductor laser device has been remarkably enhanced. In the field of industrial applications, the semiconductor laser device is expected as a light source for a processing device for carrying out processing (for example, welding, joining, and cutting) by laser light.

Since a large number of semiconductor laser elements can be simultaneously produced from a semiconductor wafer, each semiconductor laser element has a small size, and the production efficiency of semiconductor laser elements is high. Therefore, the semiconductor laser element is suitable for a small-size light source of laser light for a semiconductor laser device in several-tens-of-W class. As the light source for such a high-output semiconductor laser device, a combination of a plurality of single-type semiconductor laser elements, and an array-type semiconductor laser element are used. The array-type semiconductor laser element includes a plurality of adjacent active regions in one chip, and a plurality of light-emission points called emitters, which are adjacent to each other, on one end surface of the chip. The single-type semiconductor laser element has one emitter on the end surface of the chip.

Furthermore, laser light emitted from the semiconductor laser device can be collected into a region of about several microns. Therefore, a semiconductor laser device capable of focusing energy of laser light on an extremely small region is suitable for local processing.

However, a semiconductor laser device used for processing is operated at output power of about 10 W to several tens of W. Therefore, an electric current necessary for operation is extremely large and an amount of heat generated in an active region of the semiconductor laser element is also extremely large as compared with those in a semiconductor laser device used for an optical disk and the like having output power in several-hundred-of-mW class. Therefore, in order to maintain a semiconductor laser device used for processing at high output with high reliability, and to operate the semiconductor laser device for a long lifetime, it is important to rapidly dissipate heat generated in the active region of the semiconductor laser element to the outside so as to suppress the temperature increase in the active region.

Patent Literatures 1 to 3 have proposed a semiconductor laser device having a structure for promoting heat dissipation of a chip. A conventional semiconductor laser device of PTL 3 is described with reference to FIG. 9.

Figure 9:
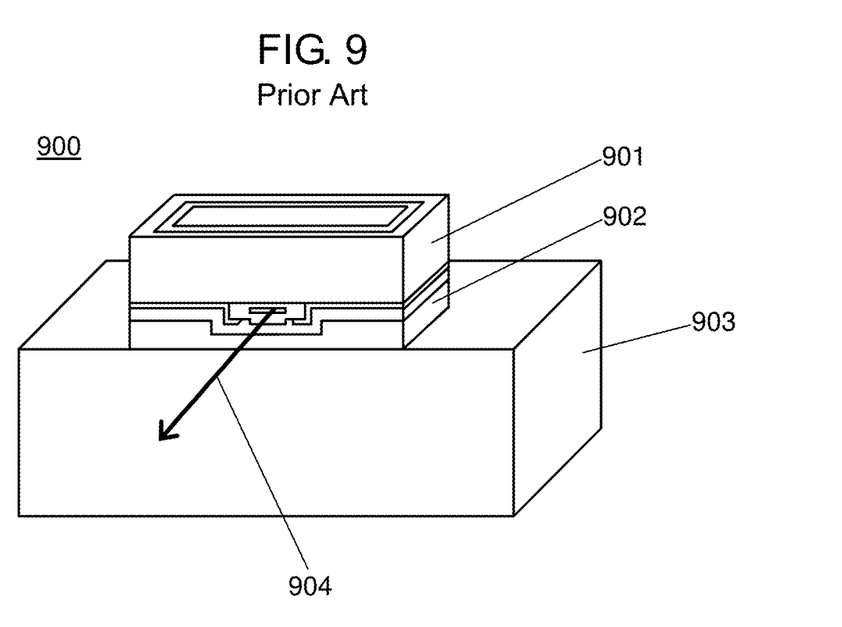
FIG. 9 is a perspective view of conventional semiconductor laser device 900.

FIG. 9 is a perspective view of conventional semiconductor laser device 900. As shown in FIG. 9, in conventional semiconductor laser device 900, semiconductor laser element 901 is packaged on heat sink 903 via solder layer 902.

Conventional semiconductor laser device 900 emits laser light 904 from a laser-emitting surface of semiconductor laser element 901, which corresponds to the forward side of FIG. 9. In the conventional semiconductor laser device 900, semiconductor laser element 901 is joined to heat sink 903 with solder layer 902 such that the laser-emitting surface of semiconductor laser element 901 is positioned in the same plane as the side surface of heat sink 903.

With this configuration, laser light 904 emitted from the laser-emitting surface of semiconductor laser element 901 is not interrupted by heat sink 903. Furthermore, heat of semiconductor laser element 901 is sufficiently dissipated by heat sink 903.

Furthermore, PTL 4 has proposed a light source device in which a function of cooling a laser diode array is enhanced by providing a passage of cooling water inside the cooling device on which laser diode array is mounted.

Furthermore, PTL 5 has proposed an electronic apparatus including a liquid cooling system. In particular, PTL 5 has proposed preventing of corrosion in a system in which aluminum and copper are present together, by adding a corrosion inhibitor to a cooling liquid and providing ion-exchange resin which has adsorbed the corrosion inhibitor.

CITATION LIST

Patent Literature

PTL 1: Japanese Patent Application Unexamined Publication No. H1-281786
PTL 2: Japanese Patent Application Unexamined Publication No. 2008-311491
PTL 3: Japanese Patent Application Unexamined Publication No. 2010-40933
PTL 4: Japanese Patent Application Unexamined Publication No. H10-209531
PTL 5: Japanese Patent Application Unexamined Publication No. 2004-47842

SUMMARY OF THE INVENTION

Conventional semiconductor laser devices have defects such as corrosion of a cooling path. To such defects, the electronic apparatus described in PTL 5 needs to use cooling water to which a corrosion inhibitor has been added, and further to provide an ion-exchanger.

The present disclosure provides a high-output semiconductor laser device in which the defects of a cooling structure of the semiconductor laser device are solved in a simpler manner and the characteristics of laser light are stable and uniform.

In order to solve the above-mentioned problems, the semiconductor laser device in accordance with the present disclosure includes a cooling plate, an insulating sheet, a first cooling block, and a first semiconductor laser element. The cooling plate includes therein a water supply passage and a drain passage, independent of each other, and is electrically conductive. The insulating sheet is provided to the cooling plate, and includes a first through hole connected to the water supply passage and a second through hole connected to the drain passage. The first cooling block is provided to the insulating sheet, includes therein a first tube connected to the first through hole and the second through hole, and is electrically conductive. The first semiconductor laser element is provided to the first cooling block. The first semiconductor laser element includes a first electrode and a second electrode opposite to the first electrode. The first electrode is electrically connected to the first cooling block, and the cooling plate is at a floating potential.

The above-mentioned configuration makes it possible to cool the semiconductor laser element by a simpler structure, and to achieve a high-output semiconductor laser device in which the laser light property is stable and uniform.

DESCRIPTION OF EMBODIMENTS

Figure 1:
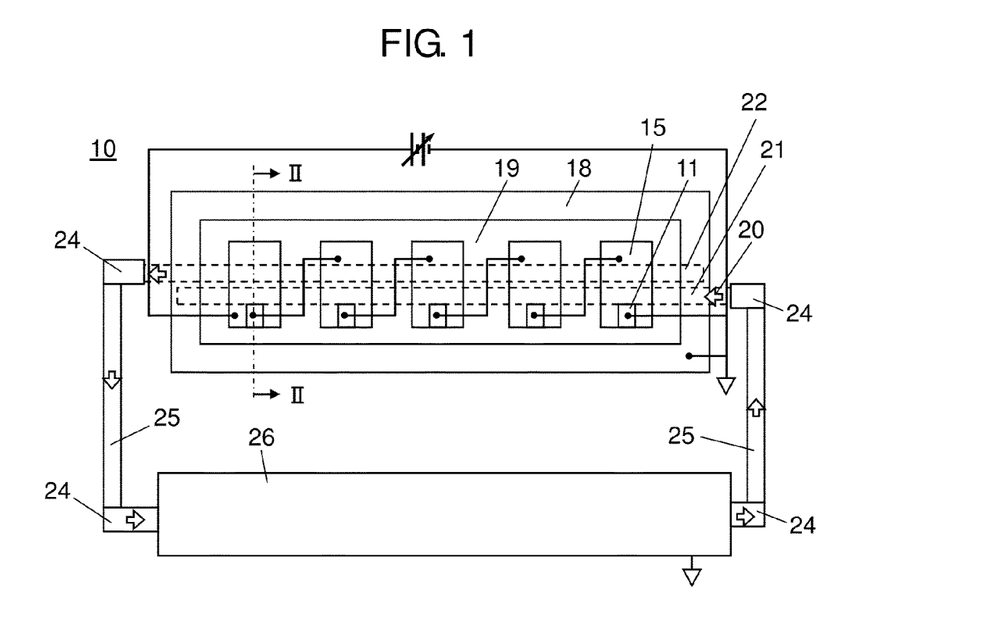
FIG. 1 is a schematic plan view of semiconductor laser device 10 and a circulation path of cooling water in accordance with an experiment of an exemplary embodiment.
Figure 2:
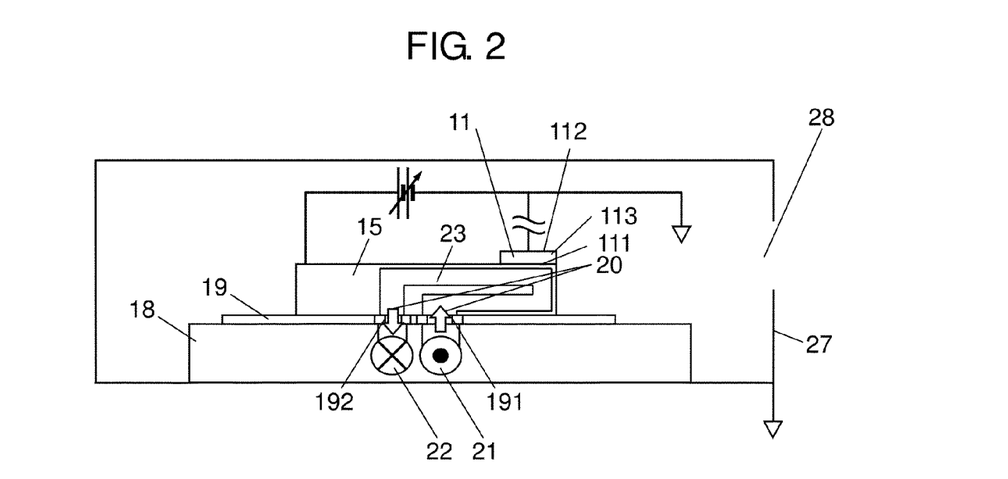
FIG. 2 is a schematic sectional view taken on line II-II of FIG. 1, showing semiconductor laser device 10 in accordance with the experiment of the exemplary embodiment.

Hereinafter, the exemplary embodiment of the present disclosure is described with reference to drawings. Note here that the same reference numerals are given to the same components and description thereof may be omitted. Furthermore, drawings schematically show mainly components for easy understanding.
EXEMPLARY EMBODIMENT FIG. 1 is a schematic plan view of semiconductor laser device 10 and a circulation path of cooling water in accordance with an experiment of an exemplary embodiment. FIG. 2 is a schematic sectional view taken on line II-II of FIG. 1, showing semiconductor laser device 10 in accordance with the experiment of this exemplary embodiment.

Figure 3:
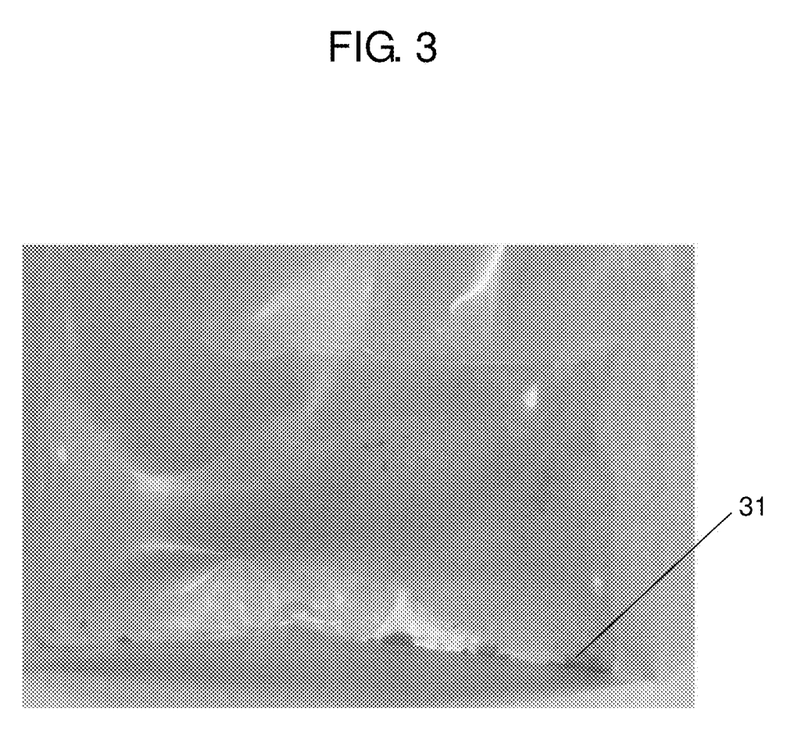
FIG. 3 is a view showing a photograph of cooling water used in the experiment of the exemplary embodiment.
Figure 4:
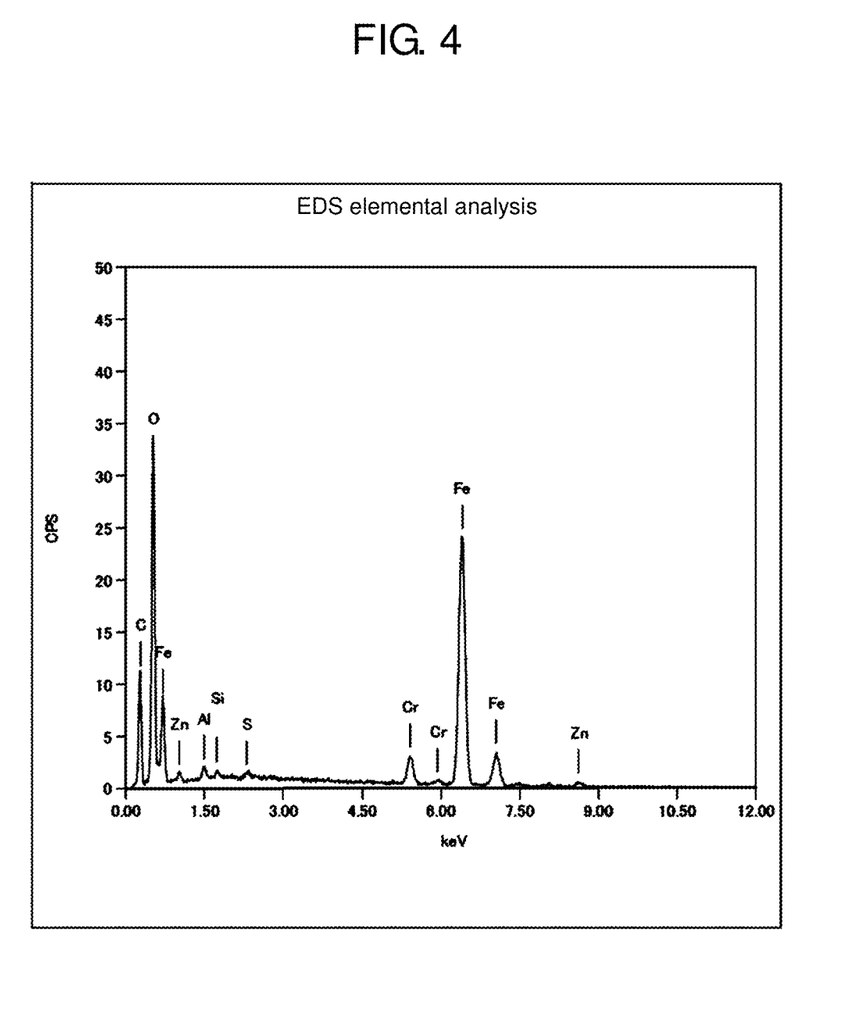
FIG. 4 is a graph showing EDS analysis results of suspended substance 31 detected in the experiment of the exemplary embodiment.
Figure 5:
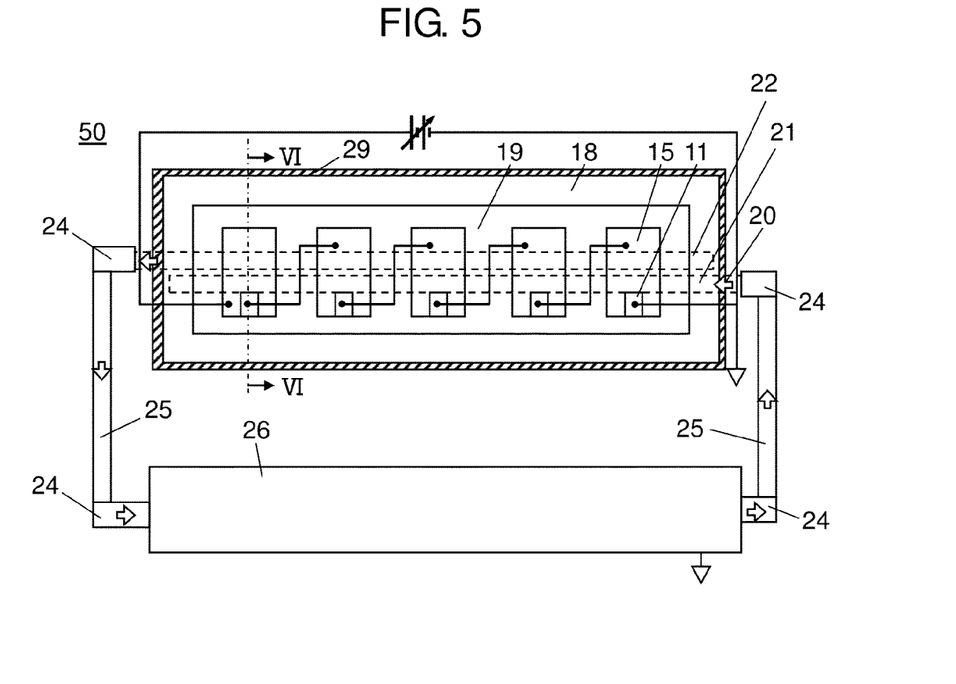
FIG. 5 is a schematic plan view of semiconductor laser device 50 and a circulation path of cooling water in accordance with the exemplary embodiment.
Figure 6:
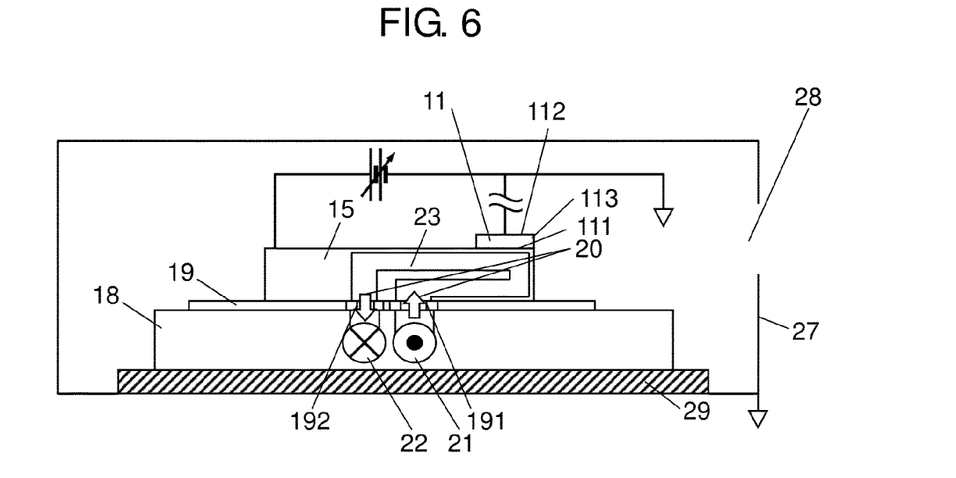
FIG. 6 is a schematic sectional view taken on line VI-VI of FIG. 5, showing semiconductor laser device 50 in accordance with the exemplary embodiment.
Figure 7A:
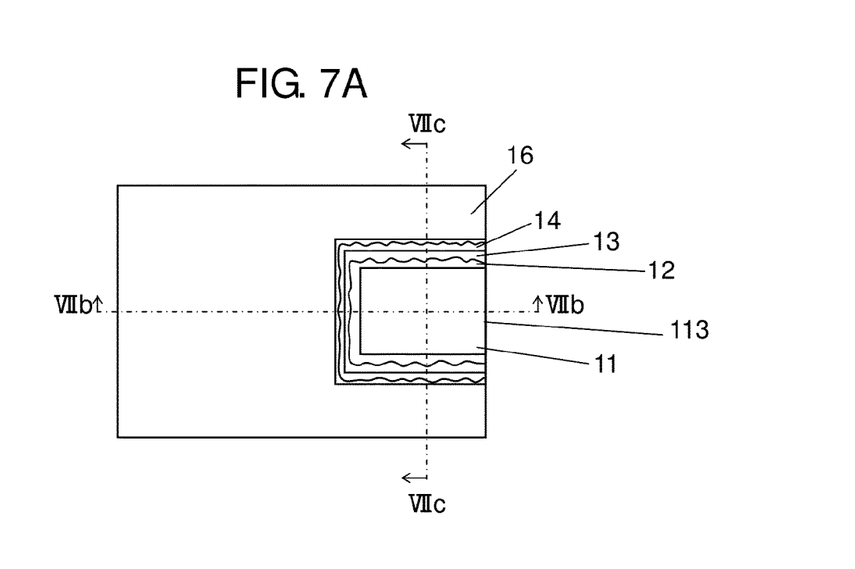
FIG. 7A is a schematic plan view showing a MCC module in accordance with the exemplary embodiment.
Figures 7B, 7C:
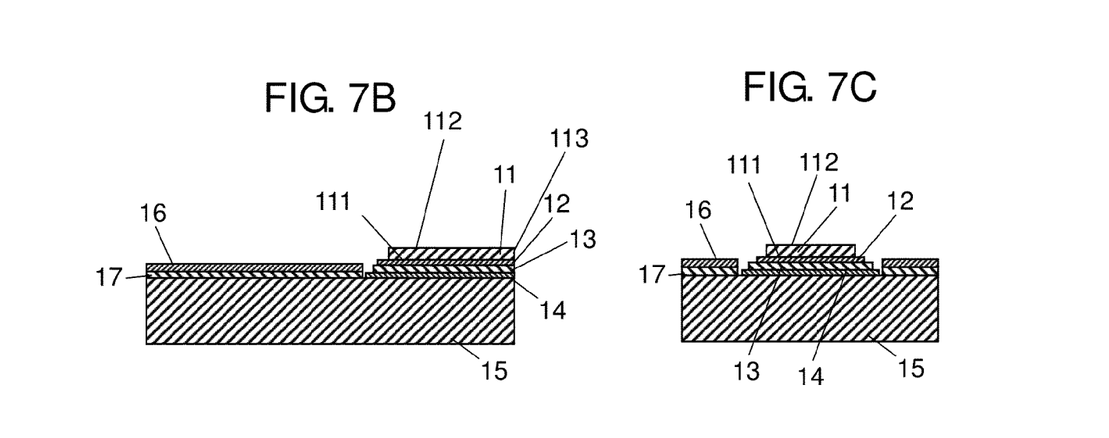
FIG. 7B is a schematic sectional view taken on line VIIb-VIIb of FIG. 7A.
FIG. 7C is a schematic sectional view taken on line VIIc-VIIc of FIG. 7A.
Figure 8A:
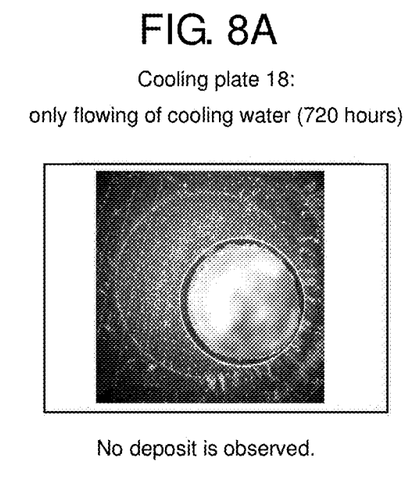
FIG. 8A is a view showing a photograph of an opening of water supply passage 21 of cooling plate 18 in accordance with the exemplary embodiment, showing a state after cooling water has been allowed to flow without operating semiconductor laser element 11 for 720 hours.
Figure 8B:
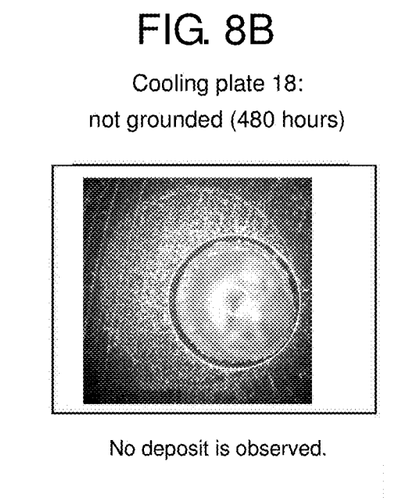
FIG. 8B is a view showing a photograph of an opening of water supply passage 21 of cooling plate 18 in accordance with the exemplary embodiment, showing a state after semiconductor laser element 11 has been operated, cooling plate 18 has been set at a floating potential and the cooling water has been allowed to flow for 480 hours.
Figure 8C:
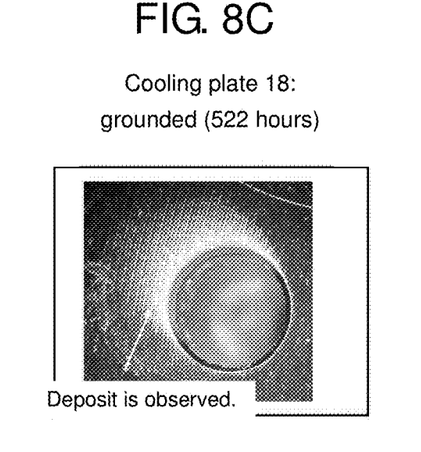
FIG. 8C is a view showing a photograph of an opening of water supply passage 21 of cooling plate 18 in accordance with the exemplary embodiment, showing a state after semiconductor laser element 11 has been operated, cooling plate 18 has been grounded and the cooling water has been allowed to flow for 552 hours.
Figure 8D:
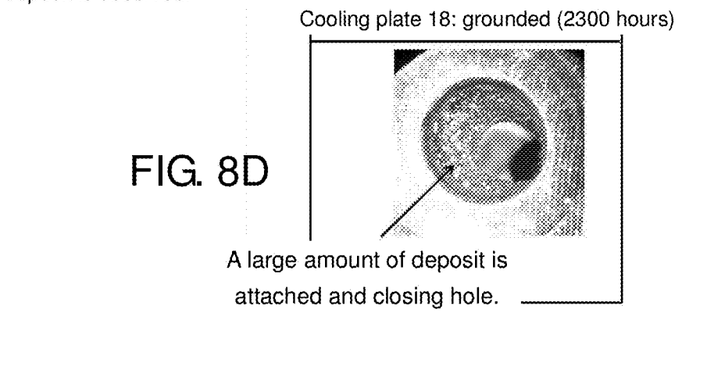
FIG. 8D is a view showing a photograph of an opening of water supply passage 21 of cooling plate 18 in accordance with the exemplary embodiment, showing a state after semiconductor laser element 11 has been operated, cooling plate 18 has been grounded and the cooling water has been allowed to flow 2300 hours.

FIG. 3 is a view showing a photograph of cooling water used in the experiment of this exemplary embodiment. FIG. 4 is a graph showing EDS analysis results of suspended substance 31 detected in the experiment of this exemplary embodiment. FIG. 5 is a schematic plan view of semiconductor laser device 50 and a circulation path of cooling water in accordance with this exemplary embodiment. FIG. 6 is a schematic sectional view taken on line VI-VI of FIG. 5, showing semiconductor laser device 50 in accordance with this exemplary embodiment. FIGS. 7A to 7C are schematic views of a MCC module in accordance with this exemplary embodiment. FIG. 7A is a schematic plan view thereof, FIG. 7B is a schematic sectional view taken on line VIIb-VIIb of FIG. 7A, and FIG. 7C is a schematic sectional view taken on line VIIc-VIIc of FIG. 7A. FIGS. 8A to 8D are views each showing a photograph of an opening of water supply passage 21 of cooling plate 18 in accordance with this exemplary embodiment. FIG. 8A shows a state after cooling water has been allowed to flow without operating semiconductor laser element 11 for 720 hours. FIG. 8B shows a state after semiconductor laser element 11 has been operated, cooling plate 18 has been set at a floating potential and the cooling water has been allowed to flow for 480 hours. FIG. 8C shows a state after semiconductor laser element 11 has been operated, cooling plate 18 has been grounded and the cooling water has been allowed to flow for 552 hours. FIG. 8D shows a state after semiconductor laser element 11 has been operated, cooling plate 18 has been grounded and the cooling water has been allowed to flow 2300 hours.

Firstly, the experiment of the exemplary embodiment is described with reference to FIGS. 1 to 4, and FIGS. 8A, 8C, and 8D. As shown in FIGS. 1 and 2, a plurality of electrically conductive cooling blocks 15 (first cooling blocks) is mounted on electrically conductive cooling plate 18 via insulating sheet 19. Furthermore, semiconductor laser element 11 (first semiconductor laser element) is mounted on each of cooling blocks 15. Cooling plate 18 and cooling block 15 are electrically insulated from each other by insulating sheet 19, and cooling block 15 and positive electrode 111 (first electrode) of semiconductor laser element 11 are electrically connected to each other. Herein, cooling block 15 on which semiconductor laser element 11 is mounted is called a MCC (Micro Channel Cooler) module. Furthermore, main material for cooling block 15 is copper, and main material for cooling plate 18 is stainless steel.

Furthermore, as shown in FIG. 1, negative electrode 112 (second electrode) of semiconductor laser element 11 is electrically connected to cooling block 15 of adjacent MCC module. Thus, the MCC modules are connected in series. Note here that in semiconductor laser element 11, positive electrode 111 is disposed to face negative electrode 112. When an electric current flows from positive electrode 111 to negative electrode 112, laser light is emitted from a light-emission point (emitter). Furthermore, in a MCC module at a first end (a MCC module at the right end in FIG. 1) among the plurality of MCC modules connected in series, negative electrode 112 of semiconductor laser element 11 is at a ground potential and is connected to the negative electrode of the power source. In a MCC module at a second end (a MCC module at the left end in FIG. 1) among the plurality of MCC modules connected in series, cooling block 15 is connected to the positive electrode of the power source. Thus, in each semiconductor laser element 11, an electric current flows from positive electrode 111 toward negative electrode 112. Note here that in FIG. 2, as to the connection between negative electrode 112 of semiconductor laser element 11 and the negative electrode of the power source or ground, other MCC modules inserted in series connection (right-side four MCC modules in FIG. 1) are not shown. Furthermore, direction of the power source may be reversed, that is, positive electrode 111 and negative electrode 112 of semiconductor laser element 11 may be replaced from each other.

In addition, as shown in FIGS. 1 and 2, cooling plate 18 includes a water supply passage 21 and drain passage 22 which are independent of each other. Water supply passage 21 and drain passage 22 of cooling plate 18 are provided with an opening for each MCC module. In addition, insulating sheet 19 includes first through hole 191 connected to the opening of water supply passage 21, and second through hole 192 connected to the opening of drain passage 22. Furthermore, cooling block 15 (first cooling block) of the MCC module is provided with first tube 23 inside thereof so as to connect first through hole 191 and second through hole 192 of insulating sheet 19 to each other. Herein, insulating O-rings, which are respectively provided to first through hole 191 and second through hole 192 of insulating sheet 19, may be interposed between cooling block 15 and cooling plate 18. Note here that in semiconductor laser device 10 provided with two MCC modules, the second MCC module is provided with a second semiconductor laser element, a second cooling block, a second tube, a third through hole, a fourth through hole, a third electrode as a positive electrode, and a fourth electrode as a negative electrode, corresponding to a first semiconductor laser element, a first cooling block, a first tube, a first through hole, a second through hole, a first electrode as a positive electrode, a second electrode as a negative electrode of the first MCC module, respectively. Note here that in the experiment of this exemplary embodiment, semiconductor laser device 10 is provided with five MCC modules, but the number of MCC modules may be one.

Furthermore, water supply passage 21 and drain passage 22 are connected to circulation device 26 using piping connector 24 and insulating piping 25. Circulation device 26 includes a heat exchanger for circulating cooling water, and dissipating heat of the cooling water. The cooling water is, for example, ion-exchanged water having electric conductivity of less than 10 μS/cm. The cooling water circulates in semiconductor laser device 10 in the direction shown by arrow 20 in FIGS. 1 and 2. Furthermore, as shown in FIG. 2, semiconductor laser device 10 is mounted inside electrically conductive housing 27 having opening 28 through which laser light passes. Housing 27 is grounded, and cooling plate 18 is connected to housing 27 and thereby is at a ground potential.

Next, an experiment using semiconductor laser device 10 is described.

Firstly, in semiconductor laser device 10, cooling water is allowed to flow for 720 hours in a state in which the power source is off and semiconductor laser element 11 is not operated. In an opening of water supply passage 21 of cooling plate 18 at this time, no deposit is observed as shown in FIG. 8A. Next, in semiconductor laser device 10, cooling water is allowed to flow for 552 hours in a state in which the power source is on and semiconductor laser element 11 is operated. In an opening of water supply passage 21 of cooling plate 18 at this time, deposit is generated as shown in FIG. 8C. Furthermore, when the cooling water is allowed to flow in this state for 2300 hours, the cooling water cannot circulate. At this time, the opening of water supply passage 21 of cooling plate 18 is being closed by deposit as shown in FIG. 8D. Furthermore, first tube 23 of cooling block 15 cannot allow the cooling water to flow, and the opening is completely closed by deposit.

Next, cooling water in a condition in which deposit is generated is described. FIG. 3 is a view showing a photograph of cooling water in which deposit is generated. As shown in FIG. 3, it is shown that suspended substance 31 is generated in the cooling water. Furthermore, FIG. 4 is a graph showing EDS (Energy Dispersive x-ray Spectroscopy) analysis results of suspended substance 31 in the cooling water. As shown in FIG. 4, since suspended substance 31 includes a large amount of iron (Fe), it is shown that suspended substance 31 is a substance of stainless steel, which is the material for cooling plate 18, dissolving and precipitating into the cooling water.

The present inventors have considered the principle of precipitation of stainless steel in cooling plate 18. When a voltage is applied and an electric current is allowed to flow between positive electrode 111 and negative electrode 112 of semiconductor laser element 11, cooling block 15 electrically connected to positive electrode 111 becomes a positive potential. At this time, it is considered that the cooling water is positively ionized and circulates in the circulation path, and dissolves stainless steel of cooling plate 18 at a ground potential. Then, stainless steel components (for example, iron) dissolved in the cooling water are saturated, and precipitate everywhere in the circulation path.

Next, the exemplary embodiment is described with reference to FIGS. 5 to 8. Note here that in FIGS. 5 and 6, the same description as in FIGS. 1 and 2 is omitted. FIG. 5 is different from FIG. 1 in that cooling plate 18 is not grounded. Furthermore, FIG. 6 is different from FIG. 2 in that cooling plate 18 is set at a floating potential by interposing insulating board 29 between cooling plate 18 and housing 27.

FIGS. 7A to 7C are schematic views of a MCC module in accordance with the exemplary embodiment. FIG. 7A is a schematic plan view thereof, FIG. 7B is a schematic sectional view taken on line VIIb-VIIb of FIG. 7A. FIG. 7C is a schematic sectional view taken on line Vile-Vile of FIG. 7A.

As shown in FIGS. 7A to 7C, in order to mount semiconductor laser element 11, on cooling block 15, conductive solder layer 14, conductive submount 13 (first conductive board), and conductive solder layer 12 are formed from a cooling block 15 side. Positive electrode 111 of semiconductor laser element 11 is connected to solder layer 12. Submount 13 adjusts the thermal expansion coefficients of cooling block 15 and positive electrode 111 of semiconductor laser element 11, and prevents semiconductor laser element 11 from warping due to difference of the expansion rate.

Furthermore, as shown in FIGS. 7A to 7C, insulating adhesive tape 17 and conductive bond plate 16 are formed from the cooling block 15 side so as to surround semiconductor laser element 11. A laser light-emitting surface of semiconductor laser element 11 is positioned such that it is on the same plane as the side surface of cooling block 15. Furthermore, the side surface of submount 13 is also positioned such that it is on the same plane as the side surface of cooling block 15. That is to say, in semiconductor laser element 11, the right side surface in FIGS. 7A and 7B is laser-emitting surface 113. Laser light is emitted from laser-emitting surface 113 to the right side.

Material for solder layer 12 is solder including gold-tin (AuSn) as a main component. The thickness of solder layer 12 is 2 to 5 µm. Semiconductor laser element 11 is adhesively bonded to submount 13 with solder layer 12. Solder layer 12 is formed on submount 13 by vapor deposition or plating. Semiconductor laser element 11 is adhesively bonded to solder layer 12 formed on submount 13.

Solder layer 12 may be formed so as to be brought into contact with the entire bottom surface of semiconductor laser element 11. As shown in FIG. 7A, it is preferable that solder layer 12 extrudes from the side surface excluding laser-emitting surface 113 of semiconductor laser element 11. Thus, it is possible to form solder layer 12 on the entire bottom surface of semiconductor laser element 11. Furthermore, solder layer 12 may be formed on the entire upper surface of submount 13.

Material for submount 13 is mainly copper tungsten (CuW). The thickness of submount 13 is about 300 µm. The material for submount 13 may include, for example, aluminum nitride (AlN).

Material for solder layer 14 is solder including tin silver (SnAg) as a main component. The thickness of solder layer 14 is about 20 µm. Submount 13 is adhesively bonded to cooling block 15 with solder layer 14. Solder layer 14 in a form of foil is formed on the upper surface of cooling block 15. Submount 13 is adhesively bonded to solder layer 14. Submount 13 can be mounted on cooling block 15 in a state in which unevenness of the surface of cooling block 15 is alleviated by the thickness of solder layer 14. Thus, heat dissipation from submount 13 to cooling block 15 can be improved.

Negative electrode 112 as the upper surface of semiconductor laser element 11 is electrically connected to conductive bond plate 16 by thin metallic wire of gold (Au) (not shown). Furthermore, insulating adhesive tape 17 and insulating sheet 19 are, for example, polyimide, but insulating material other than polyimide can be used.

Next, the advantageous effect of this exemplary embodiment is described. FIG. 8B is a view showing a photograph of a state after semiconductor laser element 11 of semiconductor laser device 50 has been operated, cooling plate 18 has been set at a floating potential, and cooling water has been allowed to flow for 480 hours. As shown in FIG. 8B, in an opening of water supply passage 21 of cooling plate 18 at this time, no deposit is observed. That is to say, it is shown that a stainless component of cooling plate 18 does not dissolve into the cooling water even when semiconductor laser element 11 is operated. The reason of this is as follows. When cooling plate 18 is set at a floating potential, even when semiconductor laser element 11 is operated and the cooling water is positively ionized, cooling plate 18 is accordingly charged so as to suppress dissolution of the stainless steel component.

Thus, it is possible to prevent clogging in a circulation path of cooling water, in particular, in first tube 23 whose passage becomes thinner in cooling block 15 by a simpler structure, and to sufficiently keep heat dissipation property of semiconductor laser element 11 stable. Thus, a high-output semiconductor laser device whose laser light property is stable and uniform can be achieved.

INDUSTRIAL APPLICABILITY

According to the present disclosure, it is possible to achieve a high-output semiconductor laser device in which cooling of a semiconductor laser element can be carried out by a simpler structure and the property of laser light is made stable and uniform. This is useful as light source for a processing device for carrying out processing by laser light (welding, joining, and cutting) and a light source for a semiconductor laser device for communication, and other consumer appliances in the field of industrial applications.

The invention claimed is:

1. A semiconductor laser device comprising:
   a cooling plate including a water supply passage and a drain passage, which are independent of each other therein, and being electrically conductive, and;
   an insulating sheet provided to the cooling plate, and including a first through hole connected to the water supply passage and a second through hole connected to the drain passage;
   a first cooling block provided to the insulating sheet, including a first tube connected to the first through hole and the second through hole therein, and being electrically conductive; and
   a first semiconductor laser element provided to the first cooling block,
   wherein the first semiconductor laser element includes a first electrode and a second electrode opposite to the first electrode,
   the first electrode is electrically connected to the first cooling block, and
   the cooling plate is at a floating potential.

2. The semiconductor laser device of claim 1, further comprising a first conductive board provided between the first electrode and the first cooling block and adjusting thermal expansion coefficients of the first electrode and the first cooling block.

3. The semiconductor laser device of claim 1, wherein the first electrode is a positive electrode, and the second electrode is a negative electrode.

4. The semiconductor laser device of claim 1, wherein cooling water flows in the water supply passage, the drain passage, and the first tube, and the cooling water is ion-exchanged water having electric conductivity of less than 10 µS/cm.

5. The semiconductor laser device of claim 1, wherein the water supply passage and the drain passage are connected to each other via a circulation device outside the cooling plate.

6. The semiconductor laser device of claim 1, wherein main material for the cooling plate is stainless steel.

7. The semiconductor laser device of claim 1, wherein main material for the first cooling block is copper.

8. The semiconductor laser device of claim 1, further comprising:
   a second cooling block provided to the insulating sheet and being electrically conductive; and
   a second semiconductor laser element provided to the second cooling block,
   wherein the insulating sheet includes a third through hole connected to the water supply passage and a fourth through hole connected to the drain passage,
   the second cooling block includes a second tube connected to the third through hole and the fourth through hole therein,
   the second semiconductor laser element includes a third electrode and a fourth electrode opposite to the third electrode,
   the third electrode is electrically connected to the second cooling block, and
   the second cooling block and the second electrode are electrically connected to each other.

* * * * *